(12) United States Patent
Chen et al.

(10) Patent No.: US 7,227,750 B2
(45) Date of Patent: Jun. 5, 2007

(54) HEAT DISSIPATING PIN STRUCTURE FOR MITIGATION OF LED TEMPERATURE RISE

(75) Inventors: Bishou Chen, Shanghai (CN); Sheng Li, Shanghai (CN); Leke Li, Shanghai (CN)

(73) Assignee: Shanghai Sansi Technology Co. Ltd., Shanghai (CN)

( * ) Notice: Subject to any disclaimer, the term of this patent is extended or adjusted under 35 U.S.C. 154(b) by 0 days.

(21) Appl. No.: 11/057,274

(22) Filed: Feb. 11, 2005

(65) Prior Publication Data
US 2005/0195566 A1 Sep. 8, 2005

(30) Foreign Application Priority Data
Feb. 13, 2004 (CN) ............ 2004 1 0016272

(51) Int. Cl.
*H05K 7/20* (2006.01)
(52) U.S. Cl. .............. 361/688; 361/704; 361/709; 361/710; 362/373; 165/80.3
(58) Field of Classification Search .......... 361/704, 361/705, 710, 712, 717–719; 257/678, 291–293, 257/99, 75, 88, 89, 81, 103, 728, 725, 433, 257/434, 720; 362/227, 296, 373, 555, 800, 362/487, 543, 545, 382, 396, 31; 165/104.33
See application file for complete search history.

(56) References Cited

U.S. PATENT DOCUMENTS 5,785,418 A * 7/1998 Hochstein ............... 362/373
6,045,240 A * 4/2000 Hochstein ............... 362/294
6,501,103 B1 * 12/2002 Jory et al. ............... 257/100
6,799,864 B2 * 10/2004 Bohler et al. ............ 362/236
6,920,046 B2 * 7/2005 Spryshak ................. 361/704
6,966,674 B2 * 11/2005 Tsai ....................... 362/294
6,999,318 B2 * 2/2006 Newby .................... 361/719
2005/0173713 A1 * 8/2005 Lin et al. ................. 257/81

FOREIGN PATENT DOCUMENTS

JP 361198657 A * 9/1986

* cited by examiner

*Primary Examiner*—Michael Datskovskiy
(74) *Attorney, Agent, or Firm*—Dorsey & Whitney LLP

(57) ABSTRACT

A heat-dissipating pin structure for mitigation of LED temperature rise, characterized in that: on metallic foil circuit or foil surfaced of PCB connecting to joining surface of LED chip, on which LED chips or light-emitting diodes of surface-mounting type or light-emitting single tube will be installed, are provided a plurality of small perpendicular through holes, in which are inserted loose-fitted and heat-conductive pins, and ends of these pins are adapted to be riveted perpendicularly or brazed directly to PCB, so that pins inserted in these holes can be fixed vertically on the back surface of PCB. Based on the principle of heat conduction, in the present invention heat generated in LED's propagates and dissipates along metallic circuit or foil surface and by means of above said pins, wherein heat conducts rapidly due to increase in cross-sectional area and radiates rapidly to surrounding atmosphere due to increase in surface area of heat-dissipating pins, thereby effectively achieving rapid dissipation of heat, suppressing temperature rise of LED working environment, ensuring displaying quality of LED, and guaranteeing normal working life of LED.

5 Claims, 2 Drawing Sheets

HEAT DISSIPATING PIN STRUCTURE FOR MITIGATION OF LED TEMPERATURE RISE

FIELD OF THE INVENTION

This invention relates to application of LED (light-emitting diode), and particularly to heat dissipation technique in LED application.

BACKGROUND OF INVENTION

Energized LED (light-emitting diode) will present a phenomenon of temperature rise, which is especially serious in case of large LED chip or when LED's are densely arranged. In that event LED lightness is impaired, radiation wavelength of LED be changed, working life of LED is influenced, and even LED will be permanently damaged.

Along with continuous extension of LED application, more and more super-bright full-color large LED display screens and LED illuminating devices, where LED's are densely arranged, are widely applied and have brought forth problem of heat rising. It is important for LED to achieve good heat dissipation. Conventional methods of heat dissipation for LED are embodied in forming technology of LED, e.g. metallic pinouts of LED are made of flat metal strips. Usually the surface area of printed-circuit board (PCB), on which LED's are implanted, is made as large as possible to facilitate heat dissipation. But these measures are limited by such highly dense arrangement of circuits on PCB, so that heat dissipation effects are seriously restricted, and up to now there is no ideal heat dissipation structure for PCB of LED's.

SUMMARY OF INVENTION

The present invention aims to overcome the shortcoming of having difficulty in heat dissipating when LEDs are densely arranged, and to provide a heat-dissipating pin structure for mitigation of LED temperature rise, thereby effectively enhancing the heat dissipating capability of densely arranged LED chips or PCB's of light-emitting diodes, providing more suitable working environmental temperature for LED, insuring better displaying quality of LED, and guaranteeing normal working life of LED.

The heat dissipating pin structure for mitigation of LED temperature rise provided by present invention is characterized in that: on metallic foil circuit or foil surface of PCB connecting to joining surface of LED chip, on which LED chips or light-emitting diodes of surface-mounting type or light-eitting single tube will be installed, are provided a plurality of small perpendicular through holes, in which are inserted loose-fitted and heat-conductive pins, and ends of these pins are adapted to be riveted perpendicularly or brazed directly to PCB, so that pins inserted in these holes can be fixed vertically on the back surface of PCB.

In above said heat-dissipating pin structure for mitigation of LED temperature rise, density of small holes arranged on PCB is consistent with degree of heat generation in corresponding region of PCB.

In above said heat-dissipating pin structure for mitigation of LED temperature rise, cross-section of small holes and heat-dissipating pins inserted in said holes may be circular, rectangular or triangular, and their size may be same or not same.

In above said heat-dissipating pin structure for mitigation of LED temperature rise, heat-dissipating pins should not be in contact with each other.

In above said heat-dissipating pin structure for mitigation of LED temperature rise, when PCB with heat-dissipating pins is encapsulated by epoxy resin, the stems of heat-dissipating pins are exposed in atmosphere.

In the present invention, based on principle of heat conduction, heat generated in LEDs propagates and dissipates along metallic foil circuit or foil surface and by means of above said pins, wherein heat conducts rapidly due to increase in cross-sectional area and radiates rapidly to surrounding atmosphere due to increase in surface area of heat-dissipating pins, thereby effectively achieving rapid dissipation of heat, suppressing temperature rise of LED working environment, ensuring displaying quality of LED, and guaranteeing normal working life of LED.

BRIEF DESCRIPTION OF APPENDED DRAWINGS

DESCRIPTION OF EMBODIMENTS OF PRESENT INVENTION

In the present invention, according to distribution of heat generation on metallic foil circuit or foil surface of PCB connecting to joining surface of LED chip, on which LED chips or LED light of surface-mounting type or light-eitting single tube will be installed, are provided a plurality of small perpendicular through holes, in which are inserted loose-fitted and good heat-conductive pins, called "heat dissipating pin". Cross-section of small holes and heat-dissipating pins can be circular, rectangular or triangular and such like according to requirement of heat dissipation and manufacturing technology, and their sizes may be same or not same. Ends of these pins are adapted to be riveted perpendicularly or brazed directly to PCB, so that pins inserted in these holes can be fixed vertically on the back surface of PCB. Whether PCB with heat-dissipating pins is encapsulated by epoxy resin or not, the stems of heat-dissipating pins should be exposed in atmosphere. Heat dissipating pins are essentially parallel to each other, and they should not be in contact between each other; but exposed heat-dissipating pin sterns may be allowed to be in contact or connected with each other, if it will not result in short circuit or erroneous connection. When PCB (or displaying module with PCB) secures physically and connects electrically with appended items, top ends of pins should not contact the appended items, thereby the heat-dissipating pins expose completely in free space between PCB and appended items to avoid short circuit. If it is desirable to be connected electrically without worry of short circuit, metallic and non-metallic surfaces of stems of heat-dissipating pins and appended items may be in close contact or in light contact, thereby playing the role of pinouts for electrical connection or further improving effects of heat dissipation.

Figure 1:
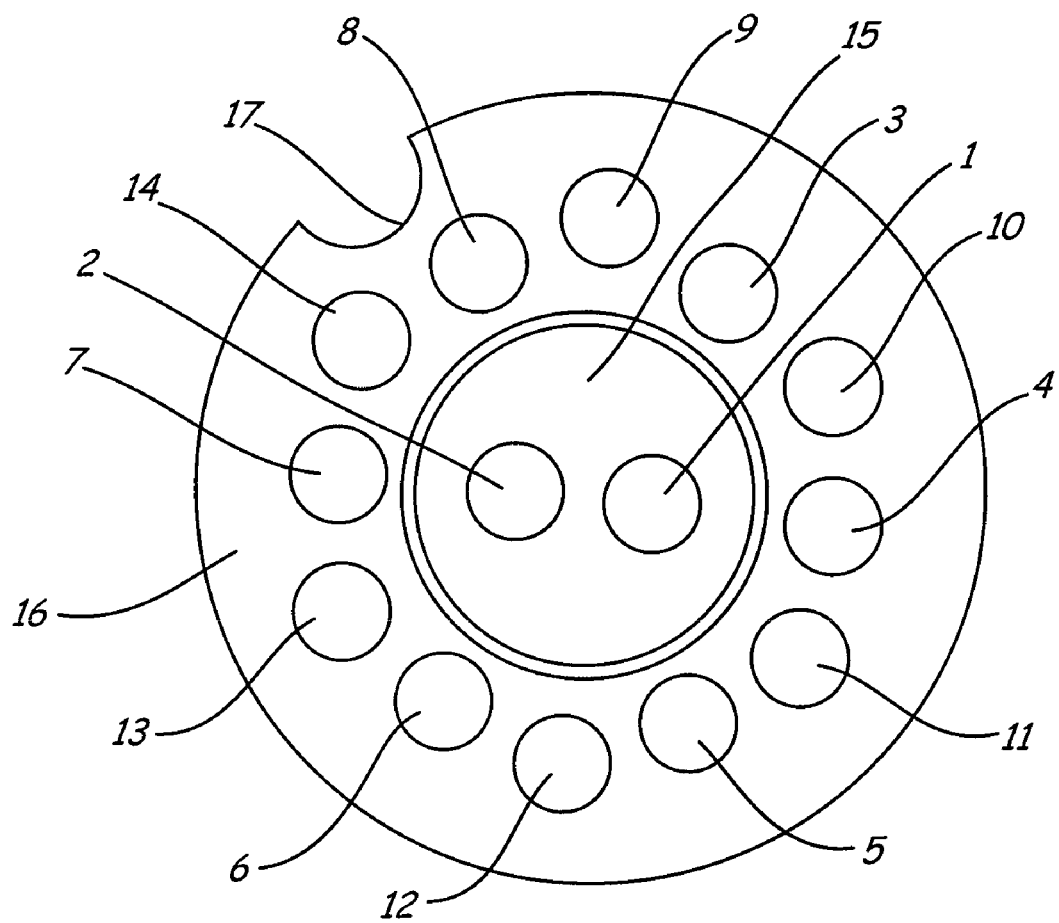
FIG. 1 shows layout view of a PCB of LED light of 5 mm in diameter with 6 LED chips according to embodiment 1 of the present invention.

Present invention is further described by means of two embodiments as follows:

Embodiment 1:

FIG. 1 shows layout view of a PCB of LED light of 5 mm in diameter with 6 LED chips, in which 6 LED chips being in parallel connection Metallic pins of Φ 0.46×10.24 mm are led out through holes 1–8 respectively, wherein holes 1–2 are used for two pinouts of same polarity of LED, and holes 3–8 are used for 6 pinouts of another polarity of LED. Holes 9–14 are used as running holes for encapsulation of epoxy resin and no metallic pins are led out from there. Reference numerals 15 and 16 denote copper foil surfaces of PCB, on which metallic pins are riveted perpendicularly. Numeral 17 is a gap for positioning. In this embodiment, above said 8 heat-dissipating pins also serve for electric pinouts, and 6 LED chips are directly secured on top ends of No. 3–8 heat-dissipating pins by means of brazing technique, so that top end of each LED chip is electrically connected to copper foil surface 15, wherein pin 1–2 serve for electric pinouts. Heat generated after energizing of said LED is rapidly conducted through heat-dissipating pins to prevent from over-heating. Multiple-tube LED lights of above said structure can serve for separate element to be directly brazed on driving PCB.

Figure 2:
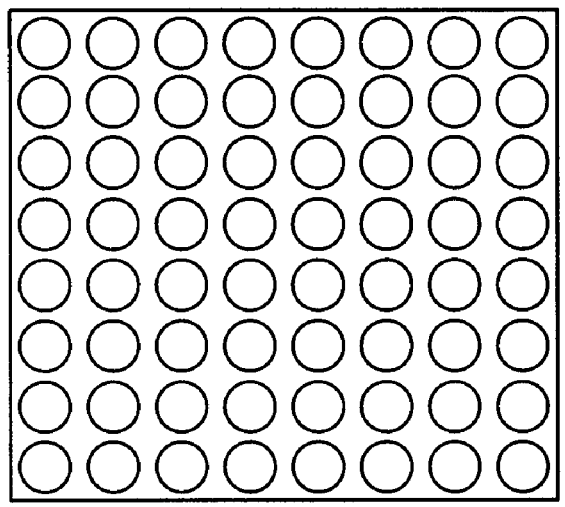
FIG. 2 shows front view of a bi-color LED matrix display module with 8×8 pixels of 10 mm spacing according to embodiment 2 of present invention (face of reflection chamber set)
Figure 3:
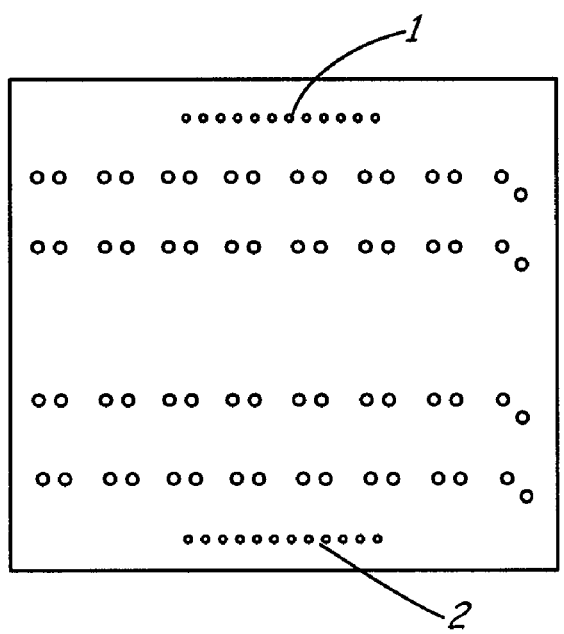
FIG. 3 is back view of FIG. 2 (PCB back face)
Figure 4:
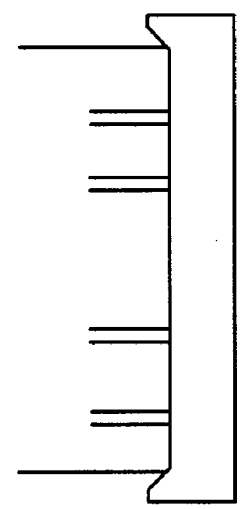
FIG. 4 is side view of FIG. 2.

Embodiment 2:

FIG. 2 shows front view of a bi-color LED matrix display module with 8×8 pixels of 10 mm spacing (face of reflection chamber set). FIGS. 3 and 4 show back view (PCB back face) and side view of FIG. 2 respectively, wherein reference numeral 1 and 2 in FIG. 3 denote two rows of pinouts (12 in each tow), and in remaining 4 rows 16 heat-dissipating pins are arranged in each row, wherein the rightmost pin is staggered in position due to limitation in arrangement of PCB. According to the circuit layout and the need of heat-dissipation, heat-dissipating pins of same column in present embodiment are connected in same polarity in electric circuit, but heat-dissipating pins of different columns should not be in contact to avoid short circuit.

It can be seen from FIG. 4 that all heat-dissipating pins are shorter than electric pinouts. When electric pinouts of displaying module are brazed on corresponding driving PCB, all heat-dissipating pins are exposed outside and not in contact with driving PCB, thereby ensuring requirement of heat dissipation and avoiding occurrence of short circuit.

In practice quantity and arrangement of heat-dissipating pins are determined both according to requirement of heat dissipation and possibility of circuit layout. Cross-sectional shape of heat-dissipating pin essentially relies on requirement of manufacturing technology. Length of heat-dissipating pin should meet not only requirement of heat dissipation but also the particular condition for fixation of LED or of related PCB, so that heat-dissipating pin has both functions of electric pinouts and heat dissipation, recommended as an option in design.

The invention claimed is:

1. A heat dissipating pin structure, comprising:
    a plurality of LEDs, each LED having a first pin for a first polarity and a second pin with a second polarity, the first and second pins being electrical conductive and heat conductive; and
    a LED PCB including a metallic foil circuit surface connecting to a joining surface of the plurality of LEDs, a first set of through holes for fitting the first pins of the plurality of LEDs, and a second set of through holes for fitting the second pins of the plurality of LEDs, wherein ends of the pins are adapted to be riveted and in electrical and heat conductive to a back surface of the LED PCB.

2. The heat-dissipating pin structure of claim 1, wherein density of the first and second sets of through holes arranged on the LED PCB is configured in accordance with degree of heat generation in corresponding region of the LED PCB.

3. The heat-dissipating pin structure of claim 1, wherein cross-section of the first and second sets of through holes and the corresponding pins are in a variety of shapes including circular, rectangular, triangular.

4. The heat-dissipating pin structure claim 1, wherein the pins do not contact with each other.

5. The heat-dissipating pin structure of claim 1, wherein when the LED PCB with the pins are encapsulated by epoxy resin, a stem of each pin is exposed in atmosphere.

* * * * *